(12) United States Patent
Kramer

(10) Patent No.: US 6,763,227 B2
(45) Date of Patent: Jul. 13, 2004

(54) SYSTEMS AND METHODS FOR MODULATOR CALIBRATION

(75) Inventor: Brad Kramer, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 455 days.

(21) Appl. No.: 10/045,385

(22) Filed: Nov. 7, 2001

(65) Prior Publication Data
US 2003/0087614 A1 May 8, 2003

(51) Int. Cl.[7] .......................... H03C 1/62; H04B 17/00
(52) U.S. Cl. ......................... 455/115.1; 455/67.11; 455/120; 332/138; 375/295
(58) Field of Search ..................... 455/67.11, 67.13, 455/67.14, 112, 113, 115.1, 115.2, 118, 120, 226.1, 423, 425; 324/74; 332/117, 137, 138, 144, 149, 103; 375/219, 298, 300, 302, 295, 296

(56) References Cited

U.S. PATENT DOCUMENTS

| | | | |
|---|---|---|---|
| 4,450,411 A | * 5/1984 | Spurr | ............................ 324/74 |
| 4,717,894 A | * 1/1988 | Edwards et al. | ............. 332/144 |
| 5,847,619 A | 12/1998 | Kirisawa | |
| 6,101,225 A | 8/2000 | Thorson | |
| 6,157,235 A | 12/2000 | Bautista et al. | |
| 6,265,949 B1 | 7/2001 | Oh | |
| 6,463,266 B1 | * 10/2002 | Shohara | ....................... 375/219 |
| 6,608,998 B1 | * 8/2003 | Neumann et al. | ......... 455/67.11 |

FOREIGN PATENT DOCUMENTS

GB        2213006 A   *  8/1989   ............ H03C/1/06

* cited by examiner

Primary Examiner—Quochien B. Vuong
(74) Attorney, Agent, or Firm—Ronald O. Neerings; Wade James Brady, III; Frederick J. Telecky, Jr.

(57) ABSTRACT

Systems and methods are provided for calibration of a transmitter system modulator, wherein local oscillator nodes of a mixer are held at first and second voltages, and a first offset value is determined. The terminals are then held at third and fourth voltages and a second offset value is determined. The first and second offset values are then averaged to provide a calibration offset value for the modulator.

28 Claims, 7 Drawing Sheets

SYSTEMS AND METHODS FOR MODULATOR CALIBRATION

FIELD OF INVENTION

The present invention relates generally to the art of transmitter apparatus and more particularly to systems and methodologies for calibration of transmitter systems.

BACKGROUND OF THE INVENTION

In broadband and wireless communications systems, information is transferred between sources and destinations through various communications media. For example, in wireless transmitter systems, analog signals carrying information are transmitted to a communications media such as the ambient via an antenna. In digital systems, the signal to be transmitted is generated initially by a digital processing system and is provided to a modulator system, where it is converted to an analog baseband signal and filtered to remove frequency components associated with the digital to analog conversion. The filtered signal is then provided to one or more mixers with associated local oscillators in the modulator system, which perform frequency translation to provide a radio frequency (RF) or intermediate frequency (IF) signal. For example, two or more such mixers may be cascaded to initially up convert an initial signal of between DC and 1 MHz to an intermediate frequency, such as 300 MHz. Thereafter, a second mixer converts the IF signal to an RF signal, such as at about 2 GHz, which is then amplified for transmission via an antenna. One or more signal conditioning circuits, such as amplifiers and/or filters, may be provided between successive mixer stages in the modulator system. Alternatively, a single modulation is performed, by which the baseband signal is modulated directly to an RF transmission frequency.

Recently, the frequencies of signals within such circuits are increasing in order to provide improved speed, conforming to communication protocols or standards, etc. Consequently, analog signal chains in such transmitter systems and the modulators thereof in modern communications systems are required to operate at ever higher frequencies with larger dynamic range, decreased distortion, improved carrier suppression, and at lower power supply voltages. In order to improve signal fidelity along the analog signal chain of transmitter modulator circuits, it is desirable to improve carrier suppression by reducing or otherwise compensating for DC offsets and/or signal leakage associated with the various components therein.

Thus, for example, in conventional digital transmitter designs, DC offsets associated with the digital to analog converter (DAC) and the low pass filter (LPF) are sometimes calibrated to improve carrier suppression. While such calibration has heretofore provided some measure of carrier suppression improvement, further reduction in system DC offsets is desired to facilitate and enhance transmitter system performance. Conventional digital transmitter systems perform a calibration to determine DC offset values for the DAC and LPF. The output of the low pass filter stage is fed back to an analog to digital converter, and an offset value is determined based on application of DC voltages to the LPF using the DAC. Subsequent signal information provided to the DAC during normal operation is offset by the offset value determined during calibration.

However, other offsets exist in typical transmitter modulator circuits, which are not taken into account in conventional modulator calibration apparatus and methodologies. For instance, DC offsets may be found in one or more mixer stages within a transmitter signal chain, which are not accounted for in current calibration techniques. Such mixer offsets result from difficulties in matching components within the mixer circuitry during fabrication of the mixer components and from leakage in the mixer circuitry. Furthermore, offsets may exist in the calibration feedback circuitry, which may inappropriately skew the calibration offset value.

For instance, Gilbert cell circuits are often employed as mixers for transmitter modulators fabricated using bipolar or BiCMOS processes. Offsets may result in Gilbert cell or other type mixer circuits, due to imperfect matching of resistors and/or transistors in the cell. Such component mismatch, for example, may allow leakage of local oscillator (LO) signal currents into the RF output of the mixer, and cause offsets in the system. This signal leakage must be minimized or reduced, or otherwise accounted for in order to attain optimal or improved carrier suppression in such devices. In this regard, Gilbert cell type mixers typically include a transconductance amplifier generating differential current signals corresponding to a baseband (e.g., or IF) input signal thereto. Mismatches in the components of the transconductance amplifier can cause leakage of the LO signal into the RF output of the mixer. In addition, mismatching of other components in the Gilbert cell type mixer, such as transistors and resistors apart from the transconductance amplifier, can also contribute to offsets in the mixer. Thus, there remains a need for improved apparatus and methodologies by which improved carrier suppression may be achieved in transmitter modulator circuits.

SUMMARY OF THE INVENTION

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of the summary is to present some concepts of the invention in a simplified form as a prelude to the more detailed description that is presented later. The invention provides systems and methodologies for calibrating transmitter circuits and devices, by which the above and other shortcomings associated with the prior art are mitigated or overcome.

Methods and systems are provided for calibrating transmitter systems, such as including Gilbert cells and other types of modulators, in which mixer nodes associated with a local oscillator (LO) input are held at certain voltages while a DC signal is provided as a baseband signal and the RF output of the transmitter mixer is monitored to ascertain a polarity associated therewith. The DC signal is then changed, such as by successively sweeping through a variety of DC values, until a polarity change is detected at the mixer RF output. The DC value at which the polarity change occurred is saved as a first offset value. The first offset value may then be used as a calibration offset factor during normal transmitter modulation operation, whereby offset effects of the mixer are compensated or accounted for in modulating baseband signals for transmission.

Alternatively or in combination, a second offset value may be determined, wherein the first and second offset values are used to derive a calibration offset value for use in normal operation. In this regard, following determination of the first offset value, the mixer nodes are held at different voltages, and the process is repeated to determine a DC value at which the mixer RF output again changes polarity, which is then saved as a second offset value. A calibration offset value for the transmitter system is then determined according to the first and second offset values, such as by averaging. The resulting calibration offset value is then added into subsequent baseband signals (e.g., either digitally or in analog form) during subsequent transmitter operation.

Because the calibration utilizes the mixer RF output as feedback, the offsets and leakage associated therewith are taken into account in the final calibration value. For instance, DC leakage from the LO input to the RF output of the mixer is factored into the calibration, as are component mismatch related offsets in the mixer. In addition, where the baseband signal path involves a digital to analog converter (DAC) and associated low pass filter (LPF) stage, offsets therein are also accounted for in the calibration offset value determined according to the invention. Furthermore, the invention provides for cancellation of offsets in the calibration feedback circuit in determining the calibration offset value. Thus, whereas prior calibration techniques introduced such feedback amplifier offset errors into the calibration factor, the present invention avoids this source of error by providing the calibration offset value based on first and second offset value determinations.

According to one aspect of the invention, a method is provided for calibrating a transmitter system having a mixer with a local oscillator (LO) input, a baseband input, and an output. The method comprises applying first and second voltages to first and second nodes associated with the local oscillator input, respectively, wherein the second voltage is greater than the first voltage, and determining a first offset value corresponding to a voltage applied to the baseband input at which the output is about zero. The first offset value may then be saved as a calibration offset value or factor for use in normal operation. Alternatively, third and fourth voltages are applied to the first and second nodes, wherein the third voltage is greater than the fourth voltage, and a second offset value is determined corresponding to a voltage applied to the baseband input at which the output is about zero. In this case, the method further comprises providing a calibration offset value according to the first and second offset values, for example, by averaging.

Another aspect of the invention provides a calibration system for calibrating a transmitter modulator having a mixer with a local oscillator input for receiving a local oscillator signal, a baseband input for receiving a baseband signal from a low pass filter, and a mixer output. The calibration system comprises a first system, such as a digital system providing a DC signal to the low pass filter during calibration and a second system, such as a feedback amplifier and comparator receiving the mixer output and providing an indication of a polarity associated with the mixer output signal to the first system during calibration. A third system individually applies voltages to first and second nodes associated with the local oscillator input during calibration, and the first system determines a first offset value corresponding to a voltage applied to the baseband input at which the mixer output is about zero when first and second voltages are applied to the first and second nodes, respectively. The first system also determines a second offset value corresponding to a voltage applied to the baseband input at which the mixer output is about zero when the third system applies third and fourth voltages to the first and second nodes, respectively. The first system then calculates or otherwise derives a calibration offset value according to the first and second offset values, such as by averaging.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. The invention relates to systems and methodologies for calibrating transmitter modulation systems and devices, by which the offset, leakage, and component mismatch issues associated with mixers thereof are accounted for. The various aspects of the invention may be implemented in many transmitter systems. In order to illustrate various features of the invention, an exemplary transmitter system 10 is illustrated and described hereinafter with respect to FIG. 1.

Figure 1:
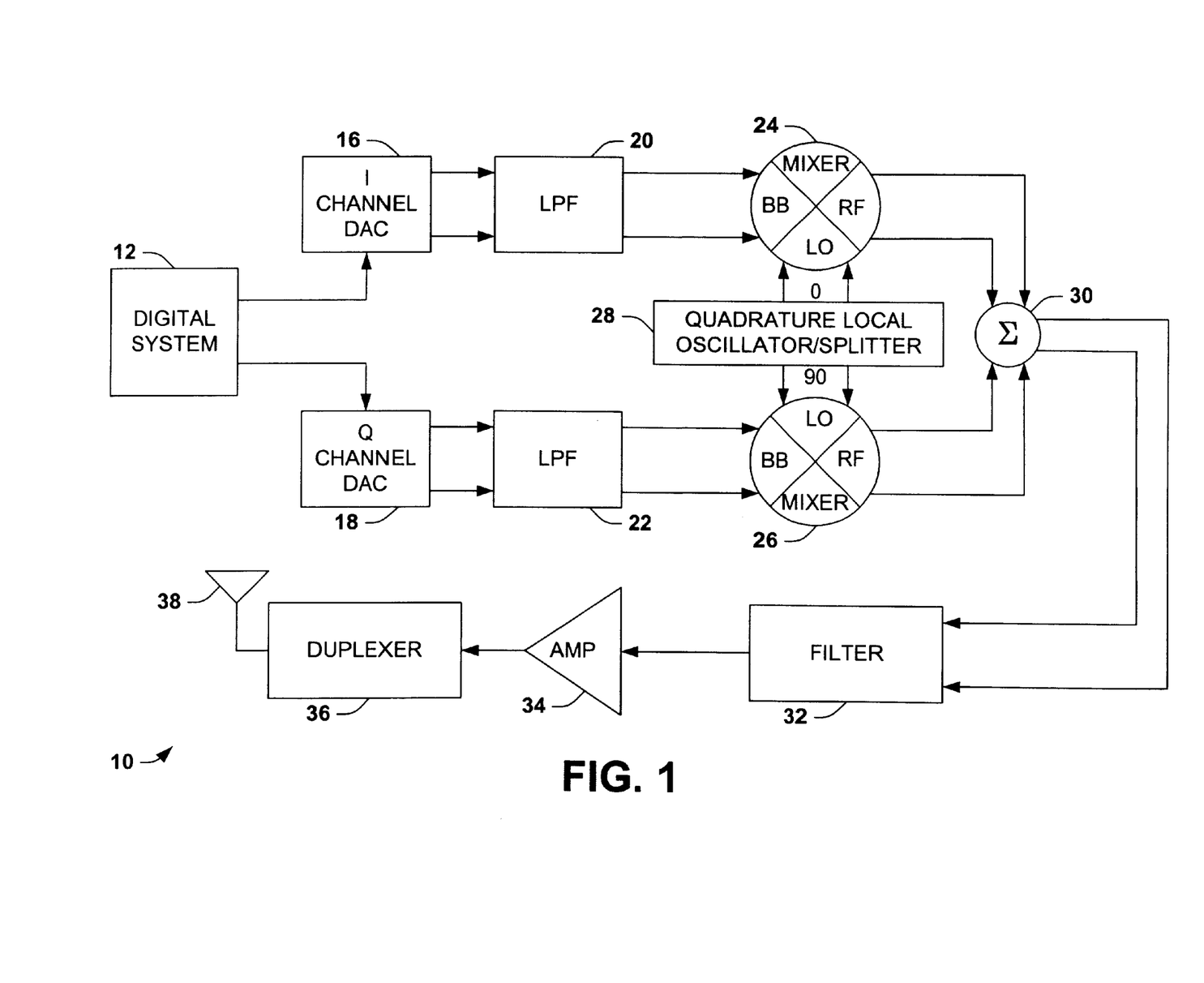
FIG. 1 is a schematic diagram illustrating an exemplary transmitter system in which one or more aspects of the present invention may be practiced.

As illustrated in FIG. 1, the system 10 comprises a digital system 12 providing digital I and Q values to I and Q channel digital to analog converters (DACs) 16 and 18, respectively, wherein "I" refers to in-phase and "Q" refers to quadrature. The I channel DAC 16 converts the in-phase digital values from the digital system 12 into a corresponding differential analog signal, which is provided to a low pass filter (LPF) 20. Similarly, the Q channel DAC 18 converts the quadrature digital value from the digital system 12 into a differential analog form, which is supplied to a low pass filter 22. The LPFs 20 and 22 filter their respective input signals to remove quantization frequency components associated with the DACs 16 and 18 and provide filtered differential signals to baseband (BB) inputs of I and Q channel mixers 24 and 26, respectively. A quadrature local oscillator system 28, provides differential radio frequency (RF) local oscillator (LO) signals of 0 and 90 degree relative phasing to the I and Q channel mixers 24 and 26, respectively.

The mixers 24 and 26 modulate the baseband signals from the LPFs 20 and 22 with the in-phase and quadrature RF sinusoids, respectively, from the oscillator system 28, wherein the oscillator system 28 may comprise a quadrature splitter receiving a sinusoid from an oscillator (not shown) and providing the in-phase and quadrature LO sinusoidal inputs to the mixers 24 and 26, respectively. The modulated I and Q RF output signals from mixers 24 and 26 are then provided to a summer 30 and combined therein. The LO signals provided by the oscillator system 28 may be at a transmit frequency, such as about 2 GHz, or may alternatively be of an intermediate frequency (IF), such as about 300 MHz. Where an intermediate frequency is employed, one or more additional mixers (not shown) may be provided thereafter, which upconvert the IF signal to the desired transmit frequency, using a radio frequency (RF) sinusoidal oscillator. In such a configuration, additional filtering and/or amplification components (not shown) may be provided between successive stages of summers and mixers.

In the illustrated system 10 of FIG. 1, the mixers 24 and 26 receive RF frequency signals (e.g., such as about 2 GHz) directly at their respective LO inputs, and provide I and Q RF signals to the summer 30 without such intermediate up conversion. The modulated signal from the summer 30 is thereafter provided to a filter 32, which filters out any undesirable frequency components and/or spurious signal noise. The signal from the filter 32 is then provided to an amplifier 34 to amplify the signal to an appropriate signal amplitude for transmission, whereafter the amplified signal is routed through a duplexer 36 and transmitted from an antenna 38 to a destination device through a transmission media (not shown). The filters 32 and amplifiers 34 may also be implemented in successive stages, (not shown). The calibration apparatus and methodologies of the present invention may be employed in association with direct quadrature modulators of the type illustrated in FIG. 1, and/or with modulators using a two step process whereby quadrature modulation is performed at an IF frequency and upconverted to the desired RF transmission frequency.

Figure 2:
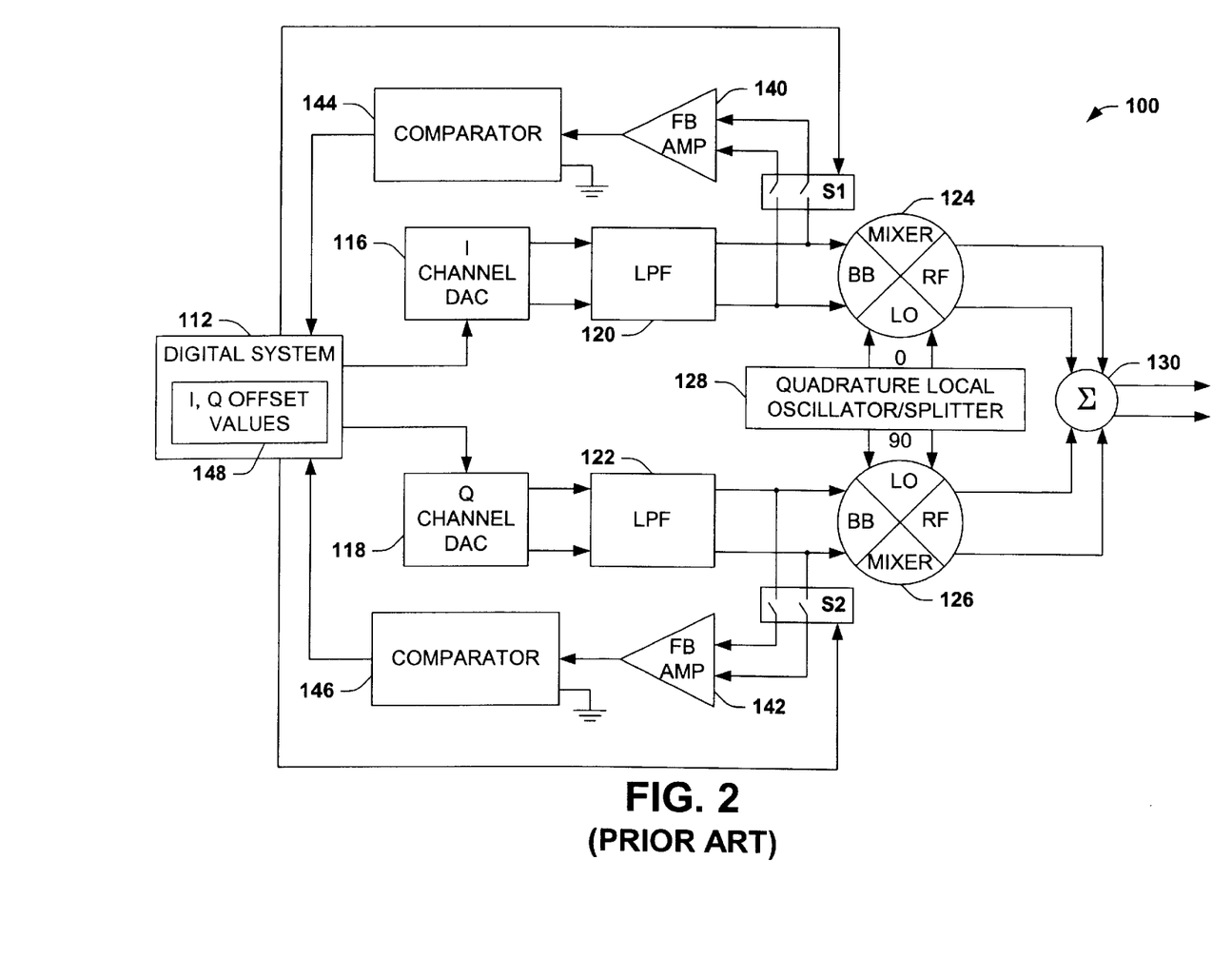
FIG. 2 is a schematic diagram illustrating a transmitter system modulator with a conventional calibration system.

Referring briefly to FIG. 2, a conventional calibration system 100 is illustrated for a modulator system having a digital system 112, I and Q channel DACs 116 and 118, respectively, low pass filters (LPFs) 120 and 122, mixers 124 and 126, a quadrature oscillator system 128, and a summer 130, operating in similar fashion to the corresponding components 12, 16, 18, 20, 22, 24, 26, 28, and 30 of the system 10 of FIG. 1. In the past, I and Q channel switches S1 and S2 were provided for feeding the outputs of LPFs 120 and 122 to feedback amplifiers 140 and 142, respectively, during calibration. The outputs of the feedback amplifiers 140 and 142 were then compared with a ground reference using comparators 144 and 146, respectively, and the comparator results were provided to the digital system 112 for determining I and Q offset values 148.

During calibration using the system 100 of FIG. 2, the local oscillator system 128 is disabled, switches S1 and S2 are closed, and the digital system 112 provides digital values to the DACs 116 and 118, causing a measurement of the outputs of the LPFs 120 and 122 using the feedback amplifiers 140 and 142, and comparators 144 and 146, respectively. The digital values output to the DACs 116 and 118 are changed until a polarity change in the LPF outputs are detected, as indicated by a state change in the outputs of the comparators 144 and 146. At this point, the current digital output values are saved as the I and Q offset values 148 in the digital system 112. In subsequent transmitter operation, the switches S1 and S2 are opened, the local oscillator system 128 again operates to provide LO signals to the mixers 124 and 126, and the offset values 148 are added to the baseband signal values by the digital system 112, in order to cancel DC offsets in the DACs 116, 118 and/or in the LPFs 120, 122. However, as mentioned above, where further improvement in carrier suppression is desired, the calibration system 100 suffers from several shortcomings, because the I and Q offset values 148 cannot fully compensate for offsets, leakages, and other problems in the system 100.

In particular, the system 100 feeds the outputs of the LPFs 120 and 122 back through the feedback amplifiers 140 and 142, respectively, in determining the digital offset values 148. It is noted that the conventional calibration system 100 thus provides offset values 148 which include any DC offsets associated with the feedback amplifiers 140 and 142, which may lead to inaccuracies in the modulation and transmission of the desired baseband signals. In addition, while the calibration system 100 accounts for offsets in the DACs 116, 118, and the LPFs 120, 122, other offsets typically exist in the modulator circuits, such as the mixers 124 and 126, which are not taken into account in the offset values 148. Such mixer offsets result from difficulties in matching components within the mixer circuitry during fabrication of the mixer components and from leakage in the mixer circuitry. Such component mismatch, for example, may allow leakage of local oscillator (LO) signal currents from the oscillator system 128 into the RF outputs of the mixers 124 and/or 126, whereby carrier suppression is worsened.

Figure 3:
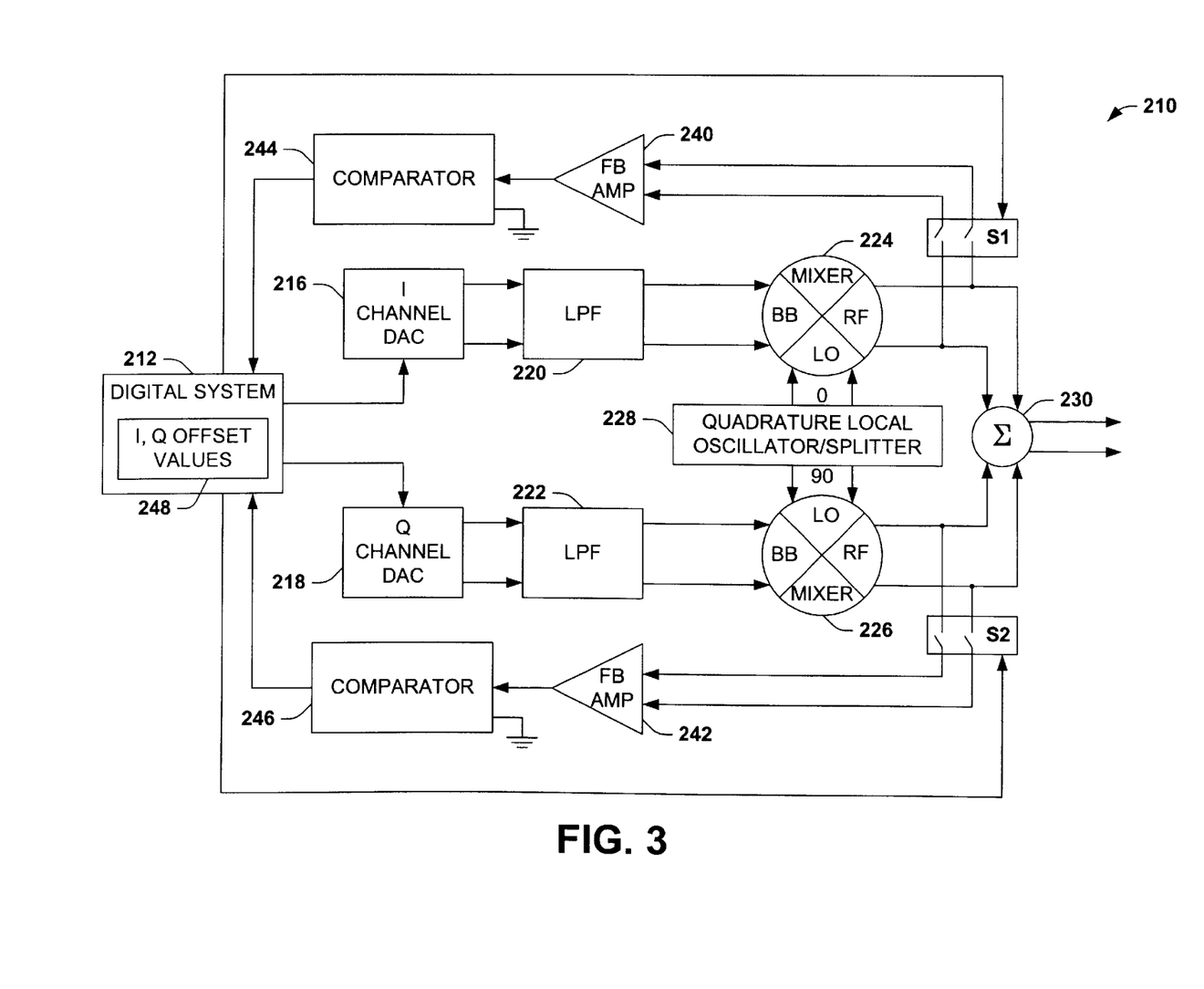
FIG. 3 is a schematic diagram illustrating an exemplary modulator calibration system in accordance with the present invention.
Figure 4:
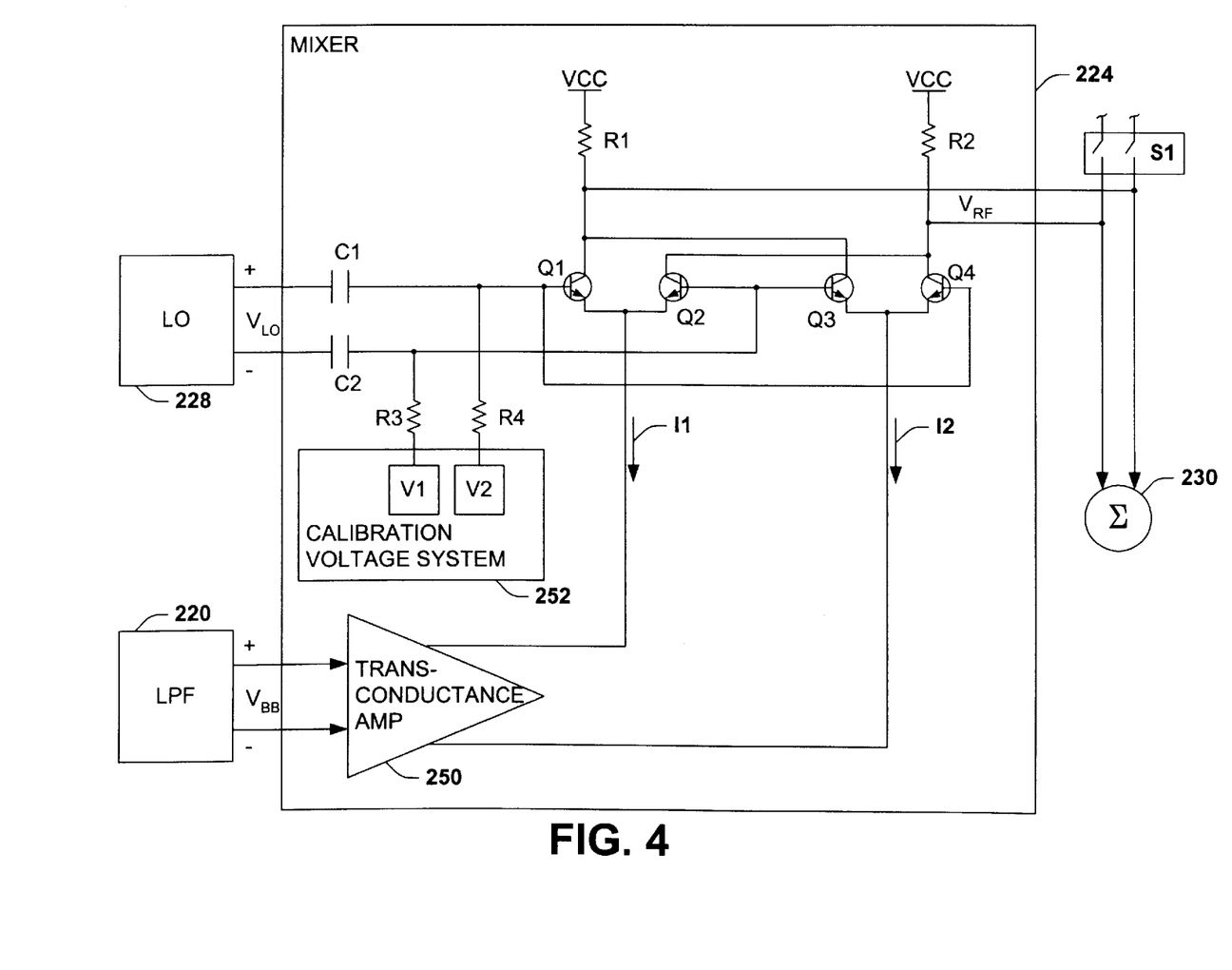
FIG. 4 is a schematic diagram illustrating further details of the calibration system in conjunction with a Gilbert cell mixer of the modulator of FIG. 3.

Referring now to FIGS. 3 and 4, the present invention advantageously provides for a system and modulator calibration techniques which account for the offsets and leakages of modulator system DACs, LPFs, and mixers, and which further account for offsets and other problems in feedback circuitry, by which significant performance improvement may be achieved compared with conventional techniques, such as illustrated in FIG. 2. In FIG. 3, a transmitter system 210 is illustrated, which comprises calibration components in accordance with the present invention. The system 210 comprises a digital system 212 to provide digital I and Q baseband signal values to I and Q channel DACs 216 and 218, respectively, which, in turn, convert these digital values into I and Q differential analog signals. The signals are then filtered using LPFs 220 and 222, which filter their respective input signals to remove quantization frequency components associated with the DACs 216 and 218 and provide filtered differential signals to baseband (BB) inputs of I and Q channel mixers 224 and 226, respectively.

A quadrature local oscillator system 228 provides differential local oscillator (LO) signals to the I and Q channel mixers 224 and 226, respectively, which then modulate the baseband signals from the LPFs 220 and 222 with the LO signals (e.g., the carrier signal) from the oscillator system 228. The modulated I and Q signals from the mixers 224 and 226 are provided to a summer 230 and combined therein. As with the system 10 of FIG. 1, the LO signals provided by the oscillator system 228 may be at a transmit frequency, such as about 2 GHz, or may alternatively be of an intermediate frequency (IF), such as about 300 MHz. Where an intermediate frequency is employed, one or more additional mixers (not shown) may be provided thereafter, which upconvert the IF signal to the desired transmit frequency, using a radio frequency (RF) oscillator, in which case, filtering and/or amplification components (not shown) may be provided between successive stages of summers and mixers.

The system 210 comprises switches S1 and S2, which are opened during normal operation, and which can be selectively closed during calibration, such as under control of the digital system 212. Closure of the switches S1 and S2 establishes feedback loops around the DACs 216, 218, the LPFs 220, 222, and the mixers 224, 226, wherein the feedback amplifiers 240 and 242 receive the RF mixer outputs of mixers 224 and 226 and provide input signals to comparators 244 and 246, respectively. During calibration of the system 210, the comparators 244 and 246 provide indications to the digital system 212 of the polarity of the RF outputs of the mixers 224 and 226, by comparison of the outputs of the feedback amplifiers 240 and 242 with a ground reference.

Referring also to FIG. 4, further details of the mixer 224 are provided, wherein the exemplary mixer 224 comprises a Gilbert cell configuration having capacitors C1 and C2, which AC couple a differential local oscillator input ($V_{LO}$) from the local oscillator system 228 to bipolar transistors Q1–Q4, and a differential transconductance amplifier 250 receiving the differential baseband input ($V_{BB}$) from the LPF 220. In normal operation, the baseband signal $V_{BB}$ in the exemplary system 210 is typically about 0.5 volts p-p maximum at a variable frequency of between DC and about 1 MHz, and is converted by the transconductance amplifier 250 into two corresponding currents I1 and I2. For the exemplary single stage (e.g., direct) modulator of the illustrated example, the sinusoidal signal $V_{LO}$ from the local oscillator system 228 is typically about 0.6 volts p-p at a transmission frequency of about 2 GHz. However, as pointed out above, the invention finds application in association with calibrating modulator systems employing multiple local oscillators, mixers, and summers, for instance, wherein the local oscillator frequency of the signal $V_{LO}$ may be an intermediate frequency (IF), such as about 300 MHz.

In accordance with an aspect of the present invention, the mixer 224 comprises a calibration voltage system 252, which operates to individually apply voltages to first and second nodes V1 and V2 associated with the local oscillator input of the mixer 224 during calibration. The calibration voltage system 252 may comprise any appropriate circuitry and components to selectively apply appropriate voltages to the nodes V1 and V2 during normal operation and during calibration as illustrated and described hereinafter, which voltages may be derived from a power supply voltage VCC or other source. During normal operation, the voltages at nodes V1 and V2 are held at the same voltage, such as about 2.0 volts for a power supply level VCC of about 2.3 volts. In addition, as described hereinafter, the calibration voltage system 252 advantageously provides individual voltages to V1 and V2 during a multi-step calibration procedure, by which offsets and other problems associated with the transistors Q1–Q4, resistors R1, R2, the transconductance amplifier 250, and/or the feedback amplifier 240 (FIG. 3) are taken into account in determining the calibration offset values 248 in the digital system 212.

During normal operation, the voltages at V1 and V2 are held to about 2.0 volts DC to establish DC biasing for the transistors Q1–Q4 through resistors R3 and R4, wherein the AC local oscillator signal $V_{LO}$ is provided to the bases of transistors through coupling capacitors C1 and C2. At the same time, the transconductance amplifier 250 establishes the currents I1 and I2 according to the baseband signal $V_{BB}$ from the LPF 220. The Gilbert cell arrangement of transistors Q1–Q4 provides modulation of the RF frequency signal $V_{LO}$ with the baseband signal $V_{BB}$ to provide a differential RF output signal $V_{RF}$ to the summer 230 for transmission during normal operation. In this regard, an ideal mixer would have precise component matching for the resistors R1 and R2, as well as for Q1–Q4. Moreover, the transistors within the differential transconductance amplifier 250 would also be matched as needed for generating the currents I1 and I2. However, fabrication processing techniques cannot guarantee precision matching, and accordingly, the present invention provides calibration techniques and systems by which the adverse effects of any component mismatches in the mixer 224 (e.g., as well as those of Q channel mixer 242 of FIG. 3) can be accounted for.

In calibration operation, the local oscillator system 228 is disabled, whereby no signal $V_{LO}$ is applied to the mixers 224, 226. At the same time, the switches S1 and S2 are closed, thereby establishing feedback of the RF outputs from the mixers 224, 226, through the feedback amplifiers 240, 242 and the comparators 244, 246, whereby the digital system 212 is provided with indications from the comparators 244, 246 of the polarities of the RF outputs from the mixers 224 and 246, respectively. Moreover, the calibration voltage system 252 in the mixer 224 (e.g., as well as a similar system in the mixer 226) provides selective application of DC voltages to nodes V1 and V2 associated with the local oscillator input during specific phases of calibration. Also, the digital system 212 is operative during calibration to provide DC signals to the low pass filters 220, 222 via digital values sent to the DACs 216 and 218, respectively.

For each of the signal paths (e.g., I and Q), the digital system 212 determines a first offset value corresponding to a voltage $V_{BB}$ applied to the baseband mixer input at which the mixer output is about zero (e.g., as detected by a polarity change therein) when the calibration voltage system 252 applies first and second voltages to the nodes V1 and V2. Thereafter, the digital system 212 determines a second offset value corresponding to a voltage $V_{BB}$ applied to the baseband input at which the mixer output is about zero when third and fourth voltages are applied to V1 and V2, respectively. A calibration offset value 248 is then determined for each signal path according to the first and second offset values associated therewith. For instance, the digital system 212 may average the first and second offset values in order to derive the calibration offset value 248 for use in normal transmitter operation.

In the illustrated example, the first and third voltages are different from one another and the second and fourth voltages are different from one another. For instance, the calibration voltage system 252 applies a first voltage of about 1.3 volts DC to V1 and a second voltage of about 2.0 volts DC to V2 during a first calibration step, and then provides a third voltage of about 2.0 volts DC to V1 and a fourth voltage of about 1.3 volts DC to V2 during a second calibration step, for a supply VCC of about 2.8 volts DC.

The calibration technique employed in the exemplary system 210 of FIGS. 3 and 4 is hereinafter described with respect to the mixer 224 and the in-phase ("I") signal path of the system 210. However, it is appreciated that complimentary operations are performed with respect to the components of the quadrature ("Q") signal path thereof, which may be performed contemporaneously or separately from the operations with respect to the in-phase channel. In the exemplary system 210, calibration begins with closure of the switches S1 and S2, and deactivation of the local oscillator system 228, for example, via control signals (not shown) from the digital system 212. In a first calibration step, the calibration voltage system 252 applies 1.3 volts to V1 and 2.0 volts to V2, by which the voltage at V2 is greater than that of node V1. Although the exemplary system 210 employs first and second voltages of 1.3 and 2.0 volts during the initial calibration step, any appropriate voltages may be used, by which transistors Q2 and Q3 are turned off (e.g., placed in cut off). In this fashion, the current I1 (from the transconductance amplifier 250 based on the baseband input $V_{BB}$ from the DAC 216 and the LPF 220) flows through resistor R1 and transistor Q1, while the current I2 flows through resistor R2 and transistor Q4.

The digital system 212 provides a digital value to the DAC 216 (e.g., as well as to DAC 218) so as to provide a constant DC input voltage level to the low pass filter 220, when the first and second voltages are applied to the V1 and V2 nodes. The feedback amplifier 240 and comparator 244 operate to provide an indication of a polarity associated with the output signal from the mixer 224. The digital system 212 then changes the digital value provided to the DAC 216, for example, by incrementing the previous value, and the polarity indication from the comparator 244 is again monitored. This process continues until an indication is received from the comparator 244 that the polarity of the mixer output has changed, at which point, the most recently provided digital value is saved as a first offset value in the digital system 212.

It is noted that in the system 210 of FIGS. 3 and 4, the comparator 244 provides a Boolean signal to the digital system 212, which is indicative of the polarity of the RF output from the mixer 224, by virtue of a comparison of the amplified signal from the feedback amplifier 240 to a ground reference, although other equivalent components and techniques can be employed to determine the signal polarity. Once the Boolean state of the signal from the comparator 244 changes, the current digital value is stored as the first offset value. In this regard it is noted that the first offset value thus corresponds to a baseband input voltage (e.g., from the DAC 216 and the LPF 220) at which the RF output of the mixer 224 is about zero. As noted above, a first offset value may likewise be obtained for the quadrature ("Q") channel in the system 210 in similar fashion, either separately from or contemporaneously with the operations to determine a first offset value for the in-phase ("I") channel.

It will be further appreciated that although the exemplary digital system 212 incrementally changes the voltage applied to the baseband input of the mixer 224 by incrementing digital values applied to the DAC 216 (e.g., sweeping from an initial value through a series of possible values until a polarity change is detected), that other numerical techniques are contemplated as falling within the scope of the present invention, for example, such as a Newton's method, by which a determination is made of a first offset value at which the mixer output is about zero. Furthermore, it is noted that the invention finds application in association with systems apart from those illustrated and described herein, for example, where a sample and hold circuit (not shown) is used to save the first and second (e.g., and the final) offset values, wherein calibration systems and techniques not involving digital systems (e.g., system 212) and digital to analog converters (e.g., DACs 216, 218) are contemplated as falling within the scope of the present invention.

In a second calibration phase or step, the calibration voltage system 252 applies a third voltage of about 2.0 volts to the node V1 and a fourth voltage of about 1.3 volts to V2, by which the voltage at V1 is greater than that of node V2. Again, while the exemplary system 210 employs third and fourth voltages of about 2.0 and 1.3 volts during the second calibration step, any appropriate voltages may be used, by which transistors Q1 and Q4 are turned off (e.g., placed in cut off). With Q1 and Q4 turned off, the current I1 (from the transconductance amplifier 250) flows through resistor R2 and transistor Q2, while the current I2 flows through resistor R1 and transistor Q3. The digital system 212 provides an initial digital value to the DAC 216 (e.g., as well as to DAC 218) so as to provide a constant DC input voltage level to the low pass filter 220, when the third and fourth voltages are applied to the nodes V1 and V2.

The feedback amplifier 240 and comparator 244 again operate to provide an indication of a polarity associated with the output signal from the mixer 224. The digital system 212 then changes the digital value provided to the DAC 216, for example, by incrementing the previous value, and the polarity indication from the comparator 244 is again monitored. This process continues until an indication is received from the comparator 244 that the polarity of the mixer output has changed, at which point, the most recently provided digital value is saved as a second offset value, with similar steps being performed to obtain a second offset value for the "Q" channel. The second offset value thus corresponds to a baseband input voltage (e.g., from the DAC 216 and the LPF 220) at which the RF output of the mixer 224 is about zero. Because of the voltages applied to the nodes V1 and V2 via the calibration voltage system 252 during the first and second calibration steps, the first and second offset values advantageously take into account any leakage associated with the transconductance amplifier 250 as well as the matching of components therein.

Once the first and second offset values are thus obtained, the digital system averages these to derive a calibration offset value 248 for the in-phase modulator channel. Although the exemplary implementation of the system 210 provides for averaging the first and second offset values, other techniques may be employed in accordance with the present invention, by which a calibration offset value 248 is obtained according to the first and second offset values. In averaging the first and second offset values, any mismatch in the components of the transconductance amplifier 250 is canceled, whereby the subsequent use of the resulting calibration offset value 248 in transmitter operation accounts for any such mismatching. In this regard, it has been found that the calibration techniques and systems of the present invention can be employed to achieve improvement of about two orders of magnitude compared with the prior techniques discussed above.

Furthermore, the averaging of the first and second offset values in determining the calibration offset value for the in-phase channel provides for cancellation of any offset issues related to the feedback amplifier 240 as well as any difference in the size of resistors R1 and R2. In similar fashion, the first and second offset values obtained during the first and second calibration phases for the quadrature ("Q") channel are averaged by the digital system 212 to obtain a calibration offset value 248 therefor. The calibration offset values 248 are then stored in the digital system 212 and used in subsequent transmitter operation as offsets to the baseband signal values being sent to the DACs 216 and 218. Thus, it is to be appreciated that the current invention provides significant advantages compared with prior techniques, in which fabrication process controls were relied upon to mitigate component matching problems, and in which the calibration did not account for offsets in the mixer or the feedback amplifier.

Another aspect of the invention provides methods for calibrating a transmitter system having a mixer with a local oscillator input, a baseband input, and an output. One such method 300 is illustrated and described hereinafter with respect to FIGS. 5a–5c. Although the exemplary method 300 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the methods according to the present invention may be implemented in association with the apparatus and systems illustrated and described herein as well as in association with other systems not illustrated.

Figure 5A:
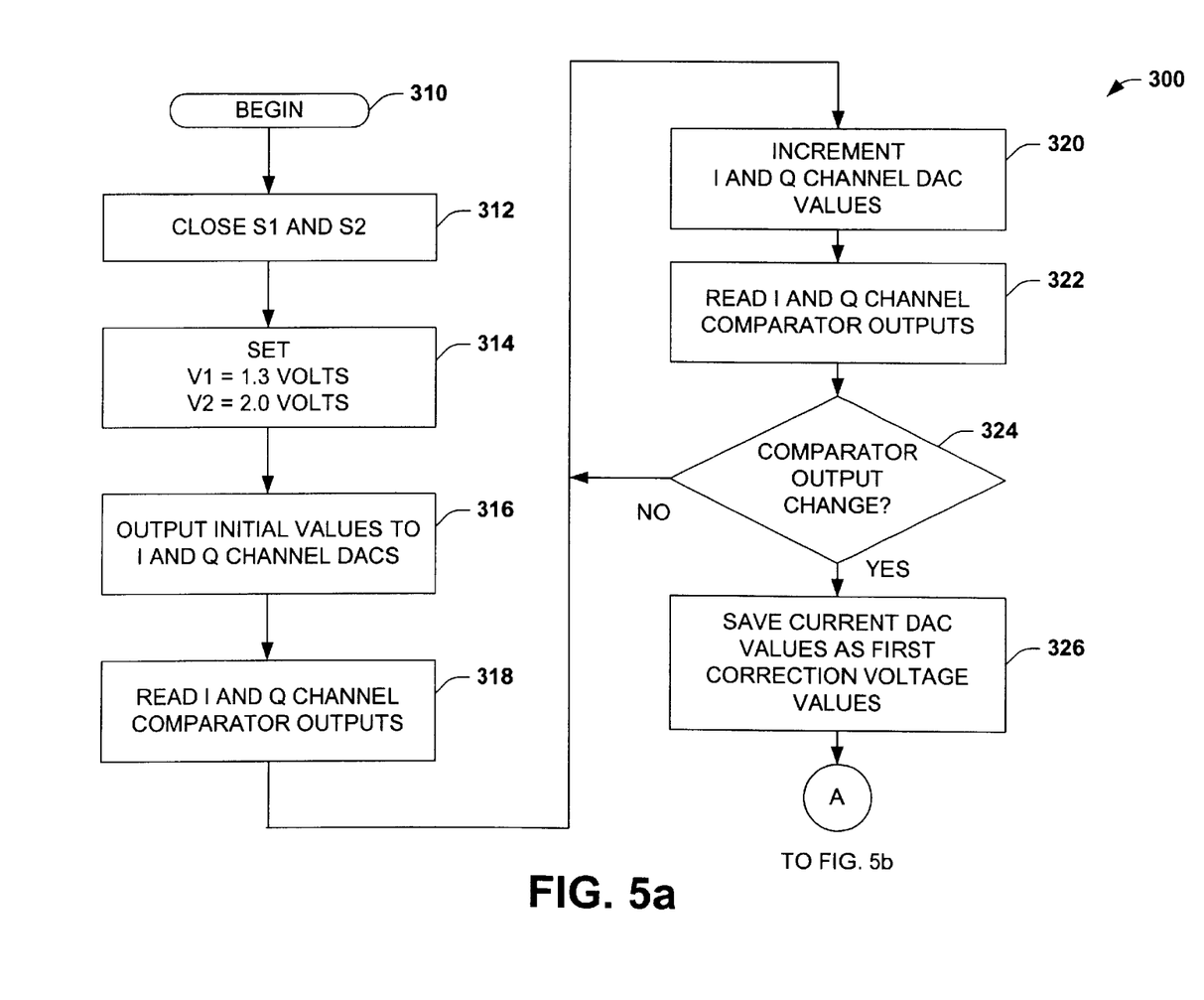
FIGS. 5a–5c are flow diagrams illustrating an exemplary method of calibrating a transmitter system in accordance with another aspect of the present invention.

Beginning at 310 in FIG. 5a, switches S1 and S2 are closed at 312 and the local oscillator system driving the mixer LO inputs is disabled. V1 is set to about 1.3 volts DC and V2 is set to about 2.0 volts at 314, and initial values are output to I and Q channel DACs at 316. Comparator outputs associated with the I and Q modulator channels are read at 318, which correspond to the mixer output polarity for the initial values applied to the DACs at 316. At 320, the values are incremented for the I and Q channel DACs and the comparator outputs are again read at 322. A determination is then made at 324 as to whether the comparator outputs have changed, thus indicating a polarity change in the mixer output. If not (e.g., no polarity change has been detected), the method 300 returns to 320, where the DAC values are again changed and the comparator outputs are again checked at 322.

Once a change in the comparator output is detected (e.g., YES at 324), the current DAC value is saved at 326 as a first correction voltage value. The operations at 312 through 326 of FIG. 5a are performed either separately or contemporaneously for the I and Q channels, wherein it is noted that polarity changes in the mixer outputs thereof may be detected at different times, corresponding to different DAC values for the I and Q channels. In this regard, it will be appreciated that more iterations of operations at 336, 338, and 340 may be required for one channel as compared with the other channel, and that the resulting first correction voltage values for the I and Q channels may be different. Although the exemplary method 300 comprises further acts for obtaining second correction voltages (offset values) for the I and Q channels, the first correction voltage values may be directly employed in normal transmitter operation without further processing, whereby the advantages are achieved over conventional modulator calibration techniques through employment of the mixer output in providing a feedback path. Thus, for example, a variant of the method 300 may end at 326, with the first correction voltage values being stored for later use in offsetting baseband output values during normal operation.

Figure 5B:
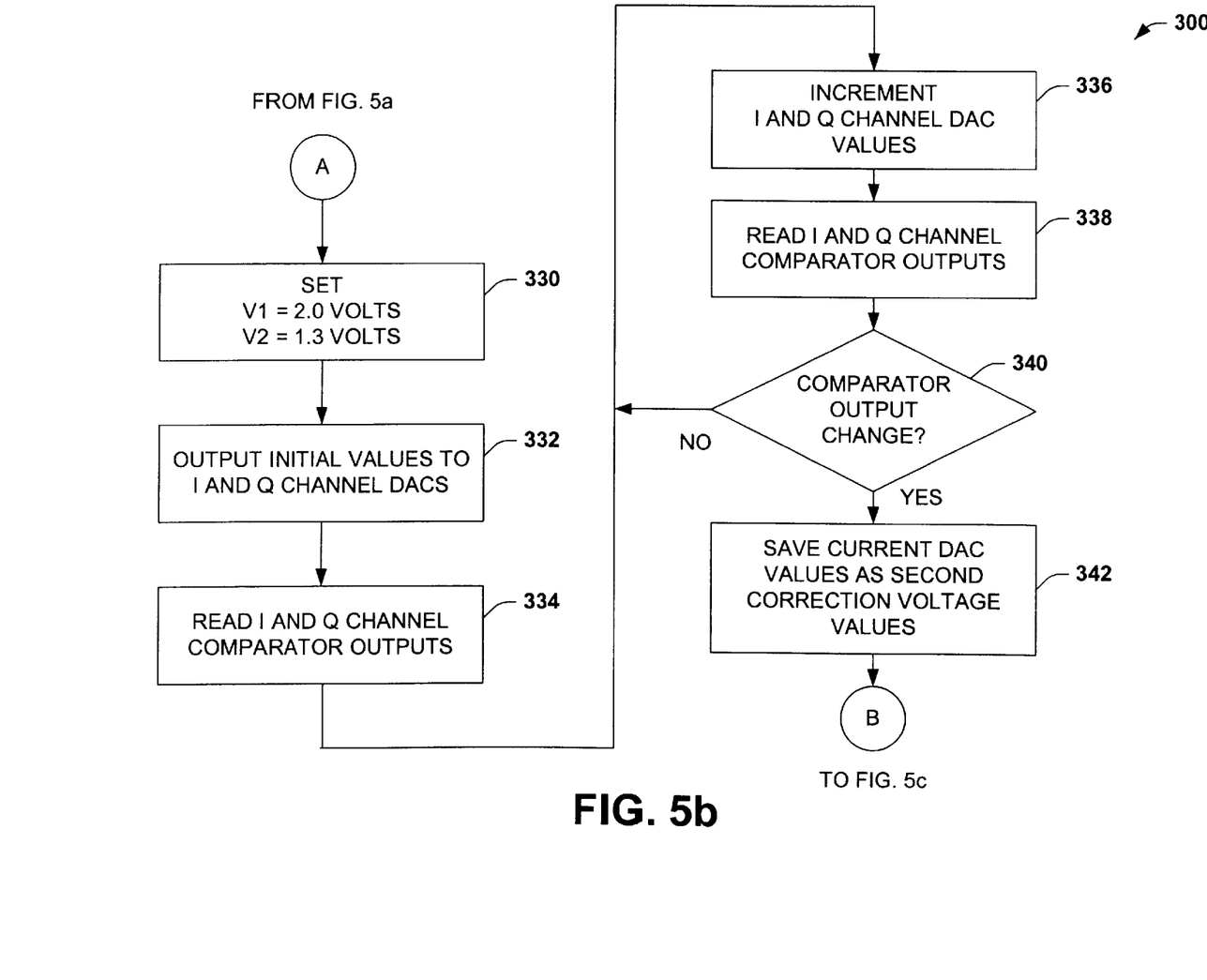

Turning now to FIG. 5b, in order to facilitate further advantages associated with the invention, the method 300 may be continued at 330, where the V1 is set to about 2.0 volts and V2 is set to about 1.3 volts. Initial values are then output to the I and Q channel DACs at 332 and the comparator outputs are read at 334. At 336, the values are incremented for the I and Q channel DACs and the comparator outputs are again read at 338. A determination is then made at 340 as to whether the comparator outputs have changed, thus indicating a polarity change in the mixer output. If not (e.g., no polarity change has been detected), the method 300 returns to 336, where the DAC values are again changed and the comparator outputs are again checked at 338. Once a change in the comparator output is detected (e.g., YES at 340), the current DAC value is saved at 342 as a second correction voltage value (e.g., corresponding to the channel for which a polarity change was detected at 324). One or more further iterations of operations at 336, 338, and 340 may be performed to obtain a resulting second correction voltage value for the other channel.

Figure 5C:
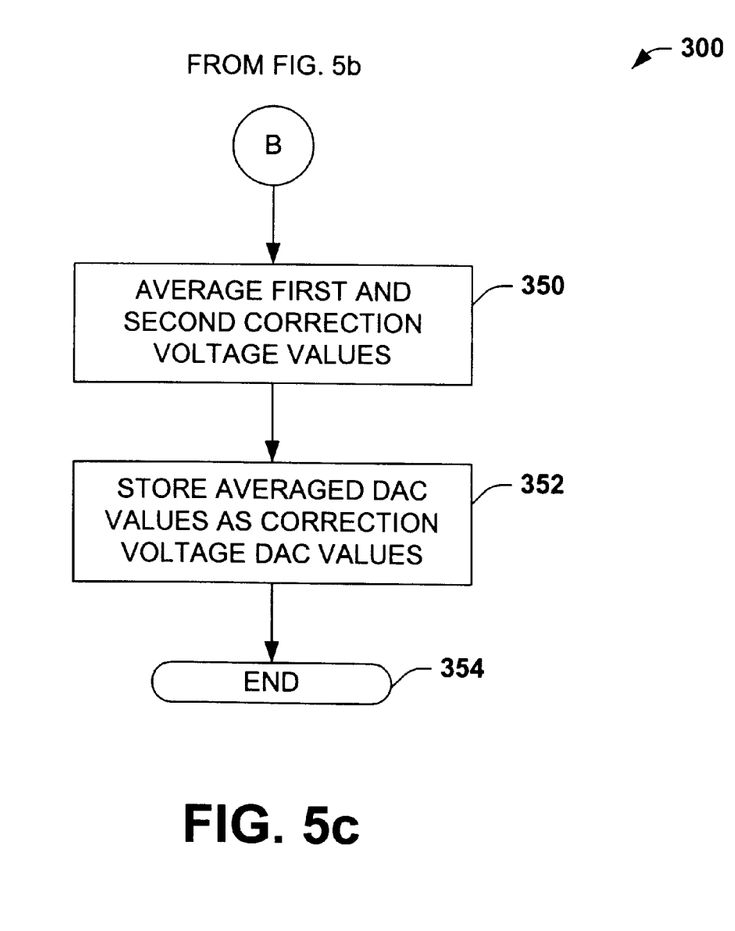

Having determined and saved first and second correction voltage values (e.g., offset values) for the I and Q channels, the method 300 proceeds to FIG. 5c, where the first and second correction voltage values are averaged (e.g., for each channel) at 350, and the resulting averaged values are stored or saved at 352 as correction voltage DAC values (e.g., calibration offset values), after which the exemplary calibration method 300 ends at 354. Thereafter, the switches S1 and S2 may be opened during normal operation of the modulator system, and the correction voltage DAC values may be used to offset baseband signal values sent to the I and Q channel DACs during transmitter operation.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method of calibrating a transmitter system having a mixer with a local oscillator input, a baseband input, and an output, the method comprising:

applying a first voltage to a first node associated with the local oscillator input;

applying a second voltage to a second node associated with the local oscillator input, wherein the second voltage is greater than the first voltage;

determining a first offset value corresponding to a voltage applied to the baseband input at which the output is about zero when the first and second voltages are applied to the first and second nodes, respectively;

applying a third voltage to the first node associated with the local oscillator input;

applying a fourth voltage to the second node associated with the local oscillator input;

determining a second offset value corresponding to a voltage applied to the baseband input at which the output is about zero when the third and fourth voltages are applied to the first and second nodes, respectively; and providing a calibration offset value according to the first and second offset values.

2. The method of claim 1, wherein determining the first offset value comprises:

applying a voltage to the baseband input when the first and second voltages are applied to the first and second nodes, respectively;

measuring a polarity associated with the output;

changing the voltage applied to the baseband input until the polarity associated with the output changes; and saving the voltage applied to the baseband input associated with the change in the output polarity as the first offset value.

3. The method of claim 2, wherein determining the second offset value comprises:
applying a voltage to the baseband input when the third and fourth voltages are applied to the first and second nodes, respectively;
measuring a polarity associated with the output;
changing the voltage applied to the baseband input until the polarity associated with the output changes; and
saving the voltage applied to the baseband input associated with the change in the output polarity as the second offset value.

4. The method of claim 3, wherein applying a voltage to the baseband input when the first and second voltages are applied to the first and second nodes, respectively, comprises providing a digital value to a digital to analog converter having an output connected to the baseband input when the first and second voltages are applied to the first and second nodes, respectively, and wherein changing the voltage applied to the baseband input comprises changing the digital value.

5. The method of claim 4, wherein saving the voltage applied to the baseband input associated with the change in the output polarity as the first offset value comprises saving the digital value provided to the digital to analog converter associated with the change in the output polarity as the first offset value.

6. The method of claim 5, wherein measuring a polarity associated with the output comprises comparing the output to a fixed voltage, and providing a digital indication of whether the output is greater than or less than the fixed voltage.

7. The method of claim 5, wherein applying a voltage to the baseband input when the third and fourth voltages are applied to the first and second nodes, respectively, comprises providing a digital value to a digital to analog converter having an output connected to the baseband input when the third and fourth voltages are applied to the first and second nodes, respectively, wherein changing the voltage applied to the baseband input comprises changing the digital value, and wherein saving the voltage applied to the baseband input associated with the change in the output polarity as the second offset value comprises saving the digital value provided to the digital to analog converter associated with the change in the output polarity as the second offset value.

8. The method of claim 3, wherein applying a voltage to the baseband input when the third and fourth voltages are applied to the first and second nodes, respectively, comprises providing a digital value to a digital to analog converter having an output connected to the baseband input when the third and fourth voltages are applied to the first and second nodes, respectively, and wherein changing the voltage applied to the baseband input comprises changing the digital value.

9. The method of claim 8, wherein saving the voltage applied to the baseband input associated with the change in the output polarity as the second offset value comprises saving the digital value provided to the digital to analog converter associated with the change in the output polarity as the second offset value.

10. The method of claim 9, wherein measuring a polarity associated with the output comprises comparing the output to a fixed voltage, and providing a digital indication of whether the output is greater than or less than the fixed voltage.

11. The method of claim 10, wherein the fixed voltage is about zero volts.

12. The method of claim 1, wherein determining the second offset value comprises:
applying a voltage to the baseband input when the third and fourth voltages are applied to the first and second nodes, respectively;
measuring a polarity associated with the output;
changing the voltage applied to the baseband input until the polarity associated with the output changes; and
saving the voltage applied to the baseband input associated with the change in the output polarity as the second offset value.

13. The method of claim 1, wherein providing a calibration offset value according to the first and second offset values comprises averaging the first and second offset values to provide the calibration offset value.

14. A transmitter system, comprising:
a modulator having a mixer with a local oscillator input for receiving a local oscillator signal, a baseband input for receiving a baseband signal, and a mixer output; and
a calibration system comprising:
a first system operatively associated with the modulator to provide a DC signal to the baseband input during calibration;
a second system operatively associated with the mixer to receive the mixer output from the mixer and to provide an indication of a polarity associated with the mixer output signal to the first system during calibration; and
a third system operatively associated with the mixer to individually apply voltages to first and second nodes associated with the local oscillator input during calibration;
wherein the first system is operative to determine a first offset value corresponding to a voltage applied to the baseband input at which the mixer output is about zero when the third system applies first and second voltages to the first and second nodes, respectively, and to determine a calibration offset value according to the first offset value.

15. The system of claim 14, wherein the first system is operative to determine a second offset value corresponding to a voltage applied to the baseband input at which the mixer output is about zero when the third system applies third and fourth voltages to the first and second nodes, respectively, and to determine the calibration offset value according to the first and second offset values.

16. The system of claim 15, wherein the first and third voltages are different from one another and wherein the second and fourth voltages are different from one another.

17. The system of claim 15, wherein the second voltage is greater than the first voltage and wherein the third voltage is greater than the fourth voltage.

18. The system of claim 17, wherein the first system is operative to average the first and second offset values to determine the calibration offset value.

19. The system of claim 18, wherein the first voltage and the fourth voltage are about 1.3 volts DC and the second and third voltages are about 2.0 volts DC.

20. The system of claim 18, wherein the mixer comprises a Gilbert cell mixer having first and second local oscillator input nodes connected to the first and second nodes by first and second resistors, respectively, wherein the third system is operative to selectively apply the first and second or the third and fourth voltages to the first and second nodes during calibration.

21. The system of claim 18, wherein the second system comprises a comparator and a feedback amplifier receiving the mixer output and providing a signal representative of the mixer output to the comparator, wherein the comparator provides a digital signal indicative of the polarity of the mixer output to the first system.

22. The system of claim 18, wherein the first system comprises a digital system operative to provide a digital value to a digital to analog converter for providing an input voltage to the low pass filter, wherein the digital system is operative to provide a digital value to the digital to analog converter when the first and second voltages are applied to the first and second nodes, respectively, to receive the an indication of a polarity associated with the mixer output signal from the second system, to change the digital value provided until an indication is received from the second system that the polarity associated with the mixer output has changed, and to save the changed digital value corresponding to the changed polarity as the first offset value.

23. The system of claim 22, wherein the digital system is operative to provide a digital value to the digital to analog converter when the third and fourth voltages are applied to the first and second nodes, respectively, to receive the an indication of a polarity associated with the mixer output signal from the second system, to change the digital value provided until an indication is received from the second system that the polarity associated with the mixer output has changed, and to save the changed digital value corresponding to the changed polarity as the second offset value.

24. The system of claim 15, wherein the first system is operative to average the first and second offset values to determine the calibration offset value.

25. A system for calibrating a modulator having a mixer with a local oscillator input, a baseband input, and an output, the system comprising:

means for applying first and second voltages to first and second nodes, respectively, associated with the local oscillator input;

means for determining a first offset value corresponding to a voltage applied to the baseband input at which the output is about zero when the first and second voltages are applied to the first and second nodes, respectively;

means for applying third and fourth voltages to the first and second nodes, respectively;

means for determining a second offset value corresponding to a voltage applied to the baseband input at which the output is about zero when the third and fourth voltages are applied to the first and second nodes, respectively; and means for averaging the first and second offset values to provide a calibration offset value.

26. A method of calibrating a transmitter system having a mixer with a local oscillator input, a baseband input, and an output, the method comprising:

applying first and second voltages to first and second nodes associated with the local oscillator input, respectively, wherein the second voltage is greater than the first voltage;

determining a first offset value corresponding to a voltage applied to the baseband input at which the output is about zero when the first and second voltages are applied to the first and second nodes, respectively; and providing a calibration offset value according to the first offset value.

27. The method of claim 26, comprising:

applying third and fourth voltages to the first and second nodes, respectively;

determining a second offset value corresponding to a voltage applied to the baseband input at which the output is about zero when the third and fourth voltages are applied to the first and second nodes, respectively; and providing the calibration offset value according to the first and second offset values.

28. The method of claim 27, wherein providing the calibration offset value comprises averaging the first and second offset values.

* * * * *